(12) United States Patent
Apostolos

(10) Patent No.: US 6,774,745 B2
(45) Date of Patent: Aug. 10, 2004

(54) ACTIVATION LAYER CONTROLLED VARIABLE IMPEDANCE TRANSMISSION LINE

(75) Inventor: John T. Apostolos, Merrimack, NH (US)

(73) Assignee: BAE Systems Information and Electronic Systems Integration Inc, Nashua, NH (US)

(*) Notice: Subject to any disclaimer, the term of this patent is extended or adjusted under 35 U.S.C. 154(b) by 0 days.

(21) Appl. No.: 10/246,241

(22) Filed: Sep. 18, 2002

(65) Prior Publication Data

US 2003/0020658 A1 Jan. 30, 2003

Related U.S. Application Data

(63) Continuation-in-part of application No. 09/849,744, filed on May 4, 2001, now Pat. No. 6,504,508, which is a continuation-in-part of application No. 09/844,135, filed on Apr. 27, 2001, now Pat. No. 6,486,850.
(60) Provisional application No. 60/203,751, filed on May 12, 2000, provisional application No. 60/202,380, filed on May 4, 2000, and provisional application No. 60/199,874, filed on Apr. 27, 2000.

(51) Int. Cl.[7] ............................................... H01P 1/18
(52) U.S. Cl. ....................................... 333/161; 333/164
(58) Field of Search ............................... 333/161, 164, 333/156, 139; 342/372, 375

(56) References Cited

U.S. PATENT DOCUMENTS

| | | | |
|---|---|---|---|
| 3,246,265 A | * 4/1966 | Smith-Vaniz | ............... 333/161 |
| 3,633,207 A | 1/1972 | Ingerson et al. | |
| 3,736,534 A | 5/1973 | Chaffee | |
| 3,754,197 A | 8/1973 | Cristal | |
| 3,754,271 A | 8/1973 | Epis | |
| 3,849,745 A | 11/1974 | Schellenberg et al. | |
| 4,010,474 A | 3/1977 | Provencher | |
| 4,095,227 A | 6/1978 | Kaloi | |
| 4,286,271 A | 8/1981 | Barbano et al. | |
| 4,293,858 A | 10/1981 | Hockham | |
| 4,410,893 A | 10/1983 | Griffee | |
| 4,604,591 A | * 8/1986 | Vasile | ................... 333/161 X |
| 4,786,914 A | 11/1988 | Wu et al. | |
| 4,899,164 A | 2/1990 | McGrath | |
| 4,914,449 A | 4/1990 | Fukuzawa et al. | |
| 4,970,524 A | 11/1990 | Hens | |
| 5,083,100 A | * 1/1992 | Hawkins et al. | ............ 333/164 |
| 5,144,319 A | 9/1992 | Roberts | |
| 5,369,381 A | * 11/1994 | Gamand | ..................... 333/161 |
| 5,504,466 A | 4/1996 | Chan-Son-Lnit et al. | |
| 5,760,661 A | * 6/1998 | Cohn | ..................... 333/161 X |
| 5,790,000 A | 8/1998 | Dai et al. | |
| 5,790,080 A | 8/1998 | Apostolos | |
| 5,892,490 A | 4/1999 | Asakura et al. | |

(List continued on next page.)

FOREIGN PATENT DOCUMENTS

| | | |
|---|---|---|
| JP | 09-169716 | 3/1997 |
| WO | WO98/49742 | 11/1998 |
| WO | WO00/52784 | 9/2000 |
| WO | WO/01/13464 | 2/2001 |

OTHER PUBLICATIONS

PCT International Search Report dated Jul. 26, 2001, of International Application No. PCT/US01/13653 filed Apr. 27, 2001.
PCT International Search Report dated Aug. 3, 2001, of International Application No. PCT/US01/14530 filed May 4, 2001.

Primary Examiner—Benny Lee
(74) Attorney, Agent, or Firm—Maine & Asmus

(57) ABSTRACT

Techniques enabling electronic control of propagation constant associated with meanderline loaded antennas and phased arrays are disclosed. An activation layer can be electronically stimulated to change its characteristics (e.g., capacitance or shape) so as to enable the control independent of antenna operating frequency.

20 Claims, 5 Drawing Sheets

U.S. PATENT DOCUMENTS

| | | |
|---|---|---|
| 5,943,011 A | 8/1999 | Acoraci et al. |
| 5,949,303 A | 9/1999 | Arvidsson et al. |
| 6,008,762 A | 12/1999 | Nghiem |
| 6,025,812 A | 2/2000 | Gabriel et al. |
| 6,034,637 A | 3/2000 | McCoy et al. |
| 6,075,424 A | 6/2000 | Hampel et al. |
| 6,094,170 A | 7/2000 | Peng |
| 6,121,931 A | 9/2000 | Levi |
| 6,218,992 B1 | 4/2001 | Sadlet et al. |
| 6,246,368 B1 | 6/2001 | Deming et al. |
| 6,313,716 B1 | 11/2001 | Apostolos |
| 6,323,814 B1 | 11/2001 | Apostolos |
| 6,373,440 B2 | 4/2002 | Apostolos |
| 6,373,446 B2 | 4/2002 | Apostolos |
| 6,384,792 B2 | 5/2002 | Apostolos |
| 6,404,391 B1 | 6/2002 | Apostolos |
| 6,630,909 B2 | 10/2003 | Nepveu |
| 2001/0035842 A1 | 11/2001 | Apostolos |

* cited by examiner

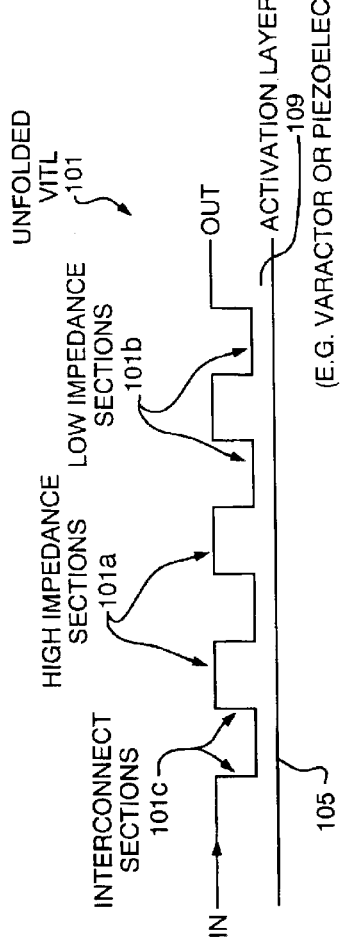
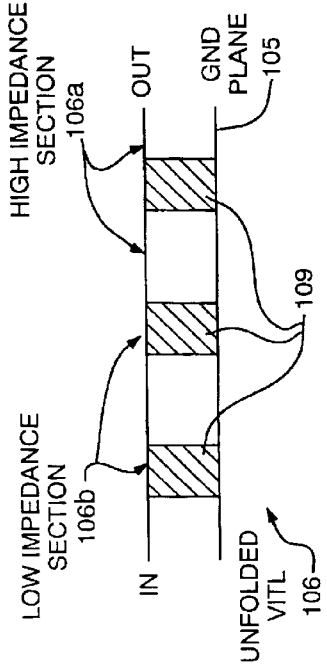
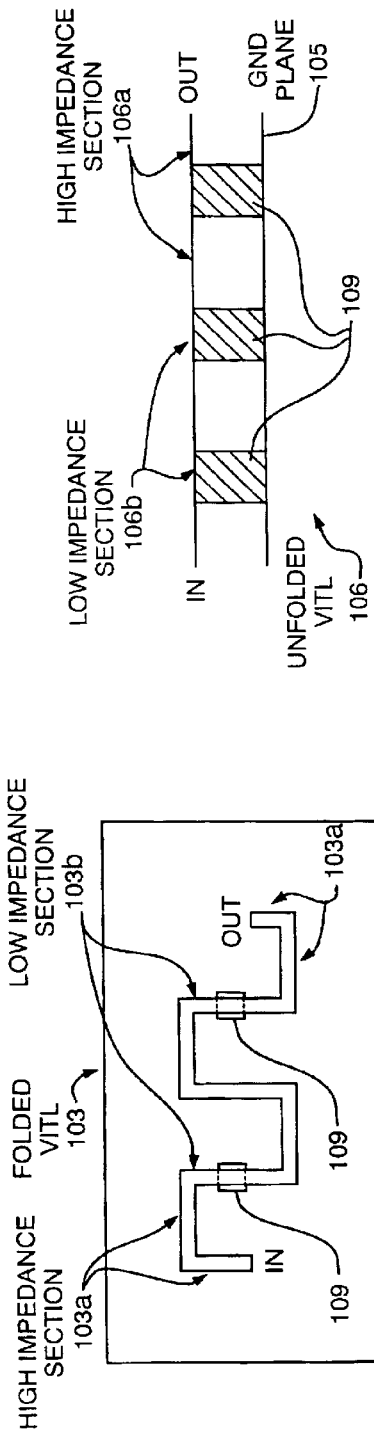

ACTIVATION LAYER CONTROLLED VARIABLE IMPEDANCE TRANSMISSION LINE

RELATED APPLICATIONS

This application is a continuation-in-part of U.S. application Ser. No. 09/844,135, filed Apr. 27, 2001, now U.S. Pat. No. 6,486,850, which claims the benefit of U.S. Provisional Application No. 60/199,874, filed Apr. 27, 2000, and U.S. Provisional Application No. 60/203,751, filed May 12, 2000. This application is also a continuation-in-part of U.S. Application Ser. No. 09/849,744, filed May 4, 2001, now U.S. Pat. No. 6,504,508, which claims the benefit of U.S. Provisional Application No. 60/202,380, filed May 4, 2000. Each of these applications is herein incorporated by reference in its entirety.

GOVERNMENT INTEREST

The United States Government may have certain rights in this invention pursuant to contract number DAAD19-01-02-0008, awarded by the United States Army.

FIELD OF THE INVENTION

The present invention relates to antennas and, more specifically to meanderline loaded antennas having adjustable delay characteristics.

BACKGROUND OF THE INVENTION

Efficient antennas typically require structures with minimum dimensions on the order of a quarter wavelength of their intended radiating frequency. Such dimensions allow an antenna to be easily excited and to be operated at or near its resonance frequency, limiting the energy dissipated in resistive losses and maximizing the transmitted energy. These conventional antennas tend to be large in size at their resonant wavelengths. Moreover, as the operating frequency decreases, antenna dimensions tend to increase proportionally.

To address shortcomings of traditional antenna design and functionality, the meanderline loaded antenna (MLA) was developed. A detailed description of MLA techniques is presented in U.S. Pat. No. 5,790,080. Wideband MLAs are further described in U.S. Pat. Nos. 6,323,814 and 6,373,440, while narrowband MLAs are described in U.S. Pat. No. 6,373,446. An MLA configured as a tunable patch antenna is described in U.S. Pat. No. 6,404,391. Each of these patents is herein incorporated by reference in its entirety.

Generally, an MLA (also known as a "variable impedance transmission line" or VITL) is made up of a number of vertical sections and horizontal sections. The vertical and horizontal sections are separated by gaps. Meanderlines are connected between at least one of the vertical and horizontal sections at the corresponding gaps. A meanderline is designed to adjust the electrical (i.e., resonant) length of the antenna, and is made up of alternating high and low impedance sections. By switching lengths of the meanderline in or out of the circuit, time delay and phase adjustment can be accomplished.

U.S. Pat. No. 6,313,716, which is herein incorporated by reference in its entirety, describes a slow wave meanderline having sections of alternating impedance relative to a conductive plate. As explained in that patents the propagation constant of a meanderline is proportional to the square root of $Z_H/Z_L$, where $Z_H$ is the impedance of the high impedance sections of the meanderline, and $Z_L$ is the impedance of the low impedance sections of the meanderline. Thus, propagation delay through the meanderline can be adjusted by mechanically switching or switching out various sections of the meanderline.

Likewise, propagation delay through the meanderline can be adjusted by physically moving sections of the meanderline. Although such configurations allow for adjustment of the propagation constant of an MLA, they require an open/close switching scheme or some other electro-mechanical interface means to effect the adjustment.

What is needed, therefore, are improved techniques for effecting a change in propagation delay in an MLA.

SUMMARY OF THE INVENTION

One embodiment of the present invention provides a method for manufacturing a variable impedance transmission line (VITL). The method includes providing a conductive reference plane, and providing an activation layer between the conductive reference plane and one or more sections of a VITL conductor thereby defining a number of low impedance sections and high impedance sections. The activation layer has characteristics which change in response to electrical stimulus, which enables control over section impedance independent of antenna operating frequency.

Another embodiment of the present invention provides a VITL circuit. The circuit includes a conductive reference plane, and an activation layer that is operatively coupled between the conductive reference plane and one or more sections of a VITL conductor thereby defining a number of low impedance sections and high impedance sections. The activation layer is associated with an activation factor which changes in response to electrical stimulus, which enables control over section impedance independent of antenna operating frequency.

Another embodiment of the present invention provides a method for controlling propagation delay through a VITL. The method includes providing an activation layer operatively coupled between a conductive reference plane and a variable impedance transmission line conductor. The conductor has a number of high impedance sections and low impedance sections. The method further includes electronically stimulating the activation layer to change its characteristics so as to enable control over propagation delay through the variable impedance transmission line independent of antenna operating frequency.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIGS. 1a, 1b, and 1c each illustrate example VITL geometries configured in accordance with embodiments of the present invention.

Figure 2:
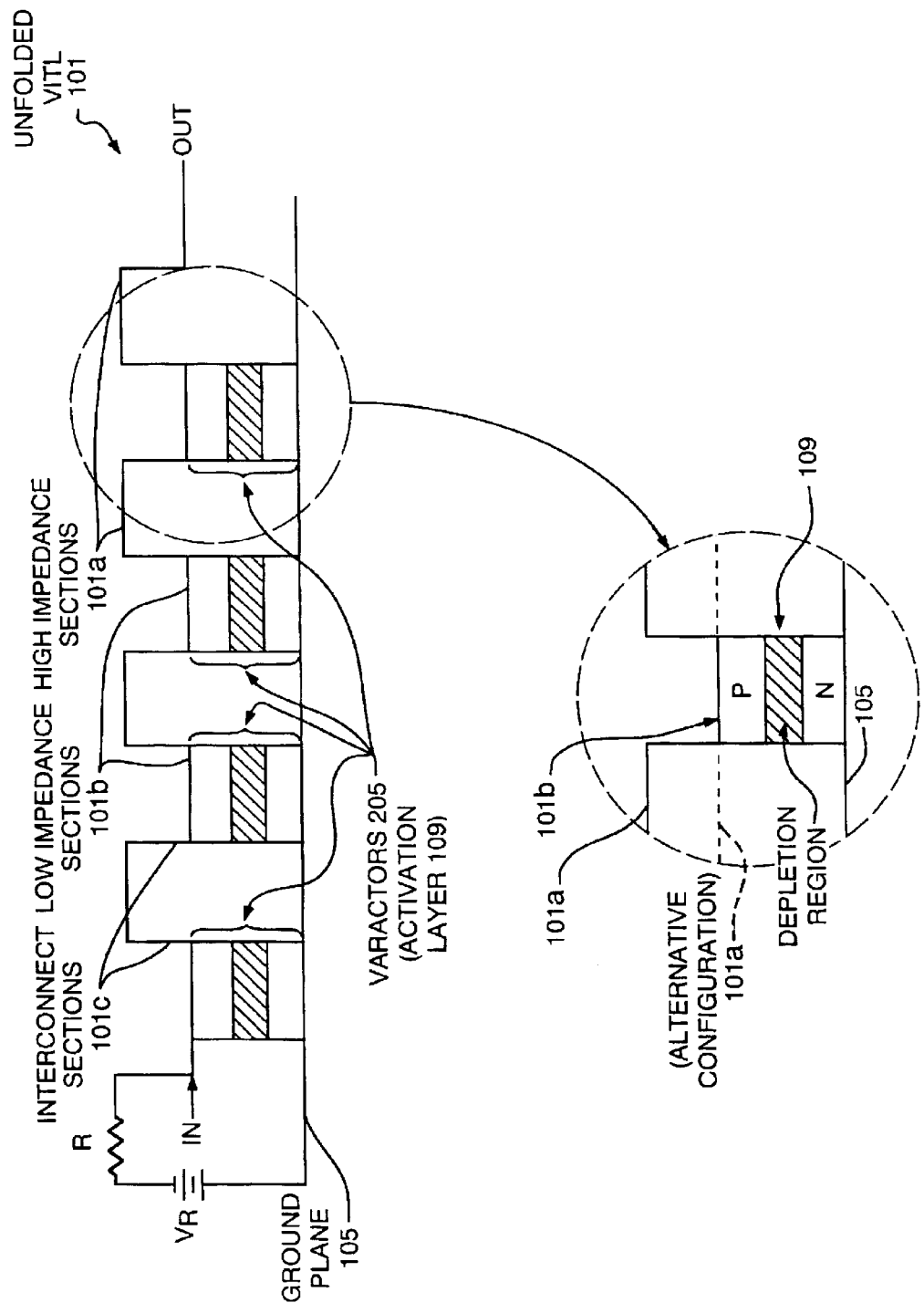
FIG. 2 illustrates a varactor controlled VITL in accordance with embodiments of the present invention.

Note that like reference labels in different figures refer to the same feature, and may not be described in detail for all drawing figures, unless otherwise indicated. For example, the labels of "IN" and "OUT" as used in the figures refer to antenna input and output, respectively.

DETAILED DESCRIPTION OF THE INVENTION

Embodiments of the present invention provide techniques for electronically controlling the propagation constant of a VITL, where no switching or mechanical manipulation of the antenna is required. By using discrete meanderline delay elements in accordance with the principles of the present invention, beamforming in smart antenna environments is simplified. In addition, a frequency independent phased array can be realized.

FIGS. 1a, 1b, and 1c each illustrate example VITL geometries configured in accordance with embodiments of the present invention. Generally, each of the illustrated VITL configurations includes a number of high and low impedance sections. These impedance sections are provided in an alternating impedance configuration from the input (IN) of the antenna to the output (OUT) if the antenna.

In more detail, unfolded VITL 101 of FIG. 1a includes sections 101a, 101b, and 101c, which are oriented in a linear or unfolded pattern with different spacing between the high impedance sections 101a and the low impedance sections 101b with respect to the ground plane 105. Folded VITL 103 of FIG. 1b includes sections 103a and 103b, which are nominally oriented in a folded pattern. Unfolded VITL 106 of FIG. 1c includes sections 106a and 106b, which are oriented in an unfolded pattern. The high and low impedance sections of VITLs 103 and 106 are an equal distance from the ground (GND) plane 105.

Planar sections 101a/101b, 103a/103b, and 106a/106b are each oriented substantially parallel to their respective ground planes 105, and are sequentially alternated thereby forming the respective transmission line. Sections 101a, 103a, and 106a are high impedance sections, while sections 101b, 103b, and 106b are low impedance sections. Interconnect sections 101c of VITL 101 in FIG. 1a function to interconnect the sections 101a and 101b. There are no interconnect sections for VITL 103 in FIG. 1b and VITL 106 in FIG. 1c.

Each VITL 101, 103, and 106 is associated with a conductive reference plane, which in this case is ground plane 105. An activation layer 109 (e.g., varactor or piezoelectric device) is deployed between sections of the antenna conductor and the ground plane 105. The activation layer in FIG. 1a may run the length of the antenna conductor or only under certain (e.g., all) low impedance sections 101b. In contrast, the activation layer of VITL 103 is implemented under the low impedance sections 103b only. Likewise, the activation layer of VITL 106 is implemented under the low impedance sections 106b only.

Other configurations and geometries will be apparent in light of this disclosure, and the present invention is not intended to be limited to any one embodiment. For example, the actual length of the antenna conductor, as well as its individual sections can vary depending on the application. Any number of high impedance sections or low impedance sections can be configured.

In one embodiment, the conductor of VITL 101 is fabricated from a single metal strip, such as a copper, which ship is bent at right degree angles to define the corresponding transmission line sections. In alternative embodiments, the conductors of VITLs 103 and 105 are fabricated from a single metal strip, such as a copper, which strip is deployed in a substantially flat fashion over the activation layer 109 to define the corresponding transmission line sections. A dielectric layer (e.g., air or substrate) can be deployed between the high impedance sections and the ground plane 105. As for the lengths of the sequential sections, in a common embodiment, each of the lengths is substantially equal.

Generally, increasing the electrical spacing of a high impedance section from its respective ground plane 105 causes that section to have a higher relative impedance as compared to the lower impedance sections. Likewise, by decreasing the electrical spacing of a low impedance section from its respective ground plane 105 causes that section to have a lower relative impedance as compared to the higher impedance sections.

Recall that the propagation constant through a VITL is dependent upon the ratio of the alternating impedance values. The characteristics of the activation layer 109, as well as the physical spacing between the antenna conductor and its corresponding ground plane, determine the impedances of the associated section of the transmission line. As such, by manipulating characteristics of the activation layer 109, the impedance of low impedance sections 101b, 103b, and 106b can be individually controlled. The propagation constant associated with the VITL can therefore be adjusted up and down with impedance changes in the low impedance sections.

FIG. 2 illustrates a varactor controlled VITL in accordance with embodiments of the present invention. As can be seen, VITL 101 is an unfolded configuration having a number of high impedance sections 101a, low impedance sections 101b, and interconnect sections 101c as described in reference to FIG. 1a. An alternative configuration is also shown (indicated with dashed line in the expanded view), where the high impedance section 101a and the low impedance sections 101b are an equal distance from the ground plane 105. In such an embodiment, the antenna conductor is essentially flat, and there are no interconnect sections 101c.

As can be seen, an activation layer 109 is deployed between the low impedance sections 101b and a conductive ground plane 105. A reverse voltage $V_R$ (e.g., 10 volts DC) and series resistance R (e.g., 5 Kohms) provide a biasing voltage to the antenna conductor. Note that there is no dielectric between the activation layer 109 and the low impedance sections 101b. As such, applying stimulus $V_R$ activates the activation layer.

In this particular embodiment, the activation layer 109 is implemented with a number of varactors 205, which are each coupled between a low impedance section 101b and the corresponding section of the ground plane 105. Varactors are designed to operate in the reverse-biased mode. As $V_R$ increases in value, the depletion region width of each varactor 205 widens. Similarly, as $V_R$ decreases in value, the depletion region width of each varactor 205 narrows.

Since the varactor's depletion region acts as a dielectric between its two conducting plates (P and N), each varacter 205 has the characteristics of a variable capacitor. Note that the varactors 205 can be implemented as discrete components, or as a semi-conductor varactor layer that is doped based on factors such as the desired range of capacitance. Generally, as $V_R$ increases, the capacitance provided by each varactor 205 decreases. A decrease in $V_R$ causes the capacitance of each varactor 205 to increase.

Thus, the variable capacitance of the activation layer varactors 205 changes in response to the $V_R$ stimulus thereby enabling control over the impedance of low impedance sections 101b and 103b. Increased capacitance generally translates to decreased impedance of the lower impedance sections 103b relative to the ground plane 105, while decreased capacitance translates to increased impedance of the lower impedance sections 103b relative to the ground plane 105. The propagation constant of VITL 101 can therefore be adjusted as needed by providing the corresponding $V_R$ stimulus.

As such, a fully electronic means for changing the propagation constant is provided, and no open/close switches or mechanical means are needed. In addition, note that the impedance value of selected lower impedance sections can be controlled independent of antenna operating frequency. Frequency independent beam scanning is thus enabled, which provides greater flexibility over conventional technologies where frequency dependent phase shifters are used to scan the beam.

VITL 101 might be utilized, for example, as a steerable phased array for wireless, satellite, or base station applications. Sections of the VITL 101 can be independently adjusted in the beamforming process to ensure a robust and reliable transmission.

Figure 3:
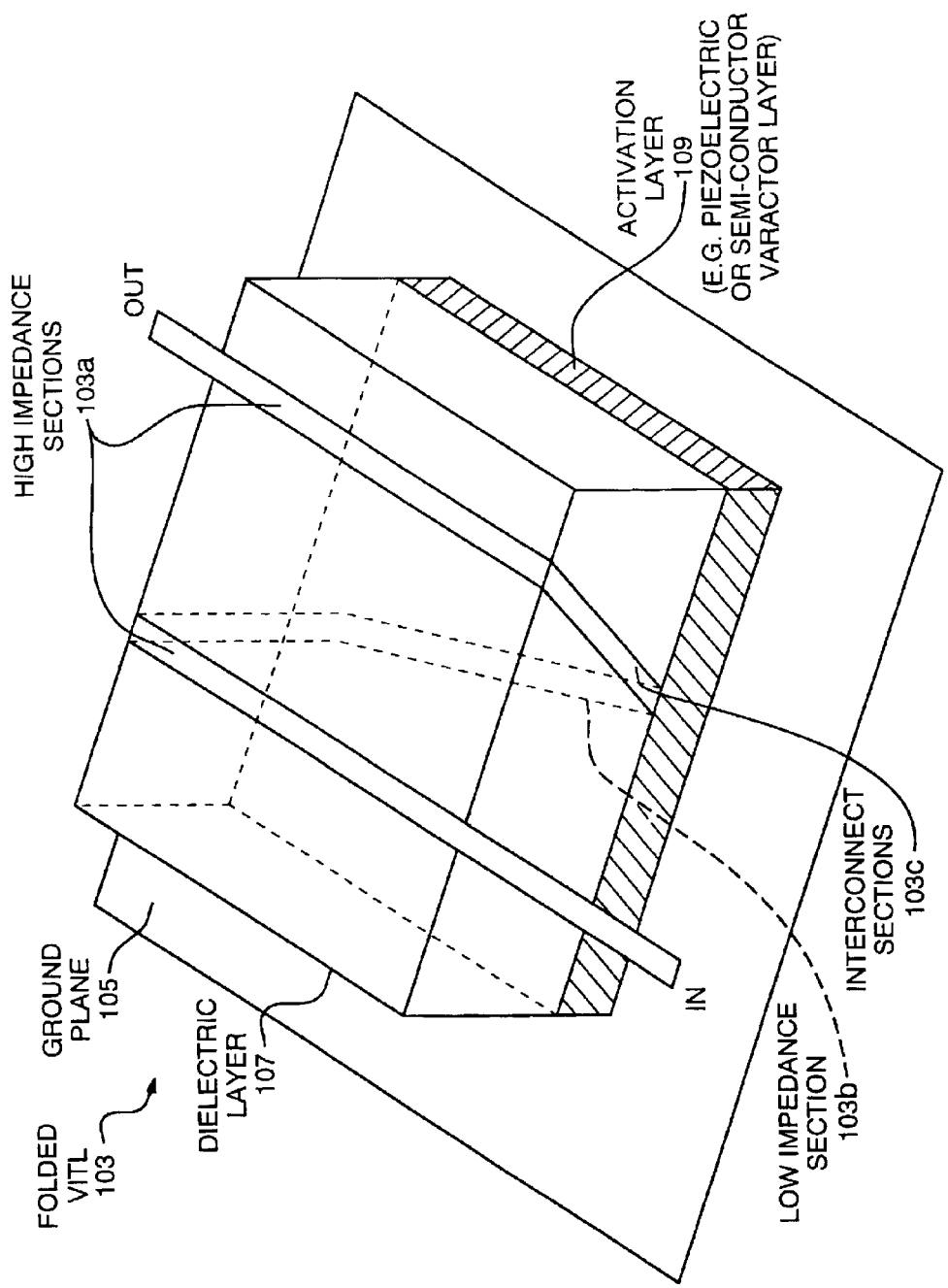
FIG. 3 illustrates a one turn discrete meanderline delay element in accordance with an embodiment of the present invention.

FIG. 3 illustrates a one turn discrete meanderline variable delay element in accordance with an embodiment of the present invention. Here, folded VITL 103 is folded about dielectric layer 107 thereby defining two high impedance sections 103a and a low impedance section 103b. Interconnect sections 103c connect the low impedance section 103b to the high impedance sections 103a, Activation layer 109 is disposed between the ground plane 105 and the dielectric layer 107 so as to sandwich the lower impedance section 103b.

The delay from the input (IN) to the output (OUT) can be controlled, for example, by changing the activation layer's distributed capacitance associated with the low impedance section 103b. As previously explained in reference to FIG. 2, this change in capacitance can be accomplished by changing a voltage ($V_R$) applied across the VITL 103 and the ground plane 105, where the activation layer 109 is a semi-conductor varactor layer, or a number of discrete varactor devices. Generally stated, higher capacitance translates to lower impedance, which translates to more propagation delay.

Alternatively, delay from the input to the output can be controlled by piezoelectrically changing the spacing between the lower impedance section 103b and the ground plane 105. In such an embodiment, the activation layer 109 could be a number of piezoelectric devices (e.g., quartz, tourmaline, or Rochelle salt based devices). The piezoelectric devices could be selectively placed between the lower impedance section 103b and the ground plane 105 in such a way that, by changing a voltage applied to the crystal devices, the devices would change shape (e.g., contract or expand) thereby changing the electrical spacing between the lower impedance section 103b and the ground plane 105.

Note that the piezoelectric devices could be selectively placed between the dielectric layer 107 and the ground plane as well. In such an embodiment, the stimulus would have to be applied to the piezoelectric devices by a mechanism other than the VITL conductor. For example, a stimulus voltage could be applied directly to the piezoelectric devices.

Figure 4:
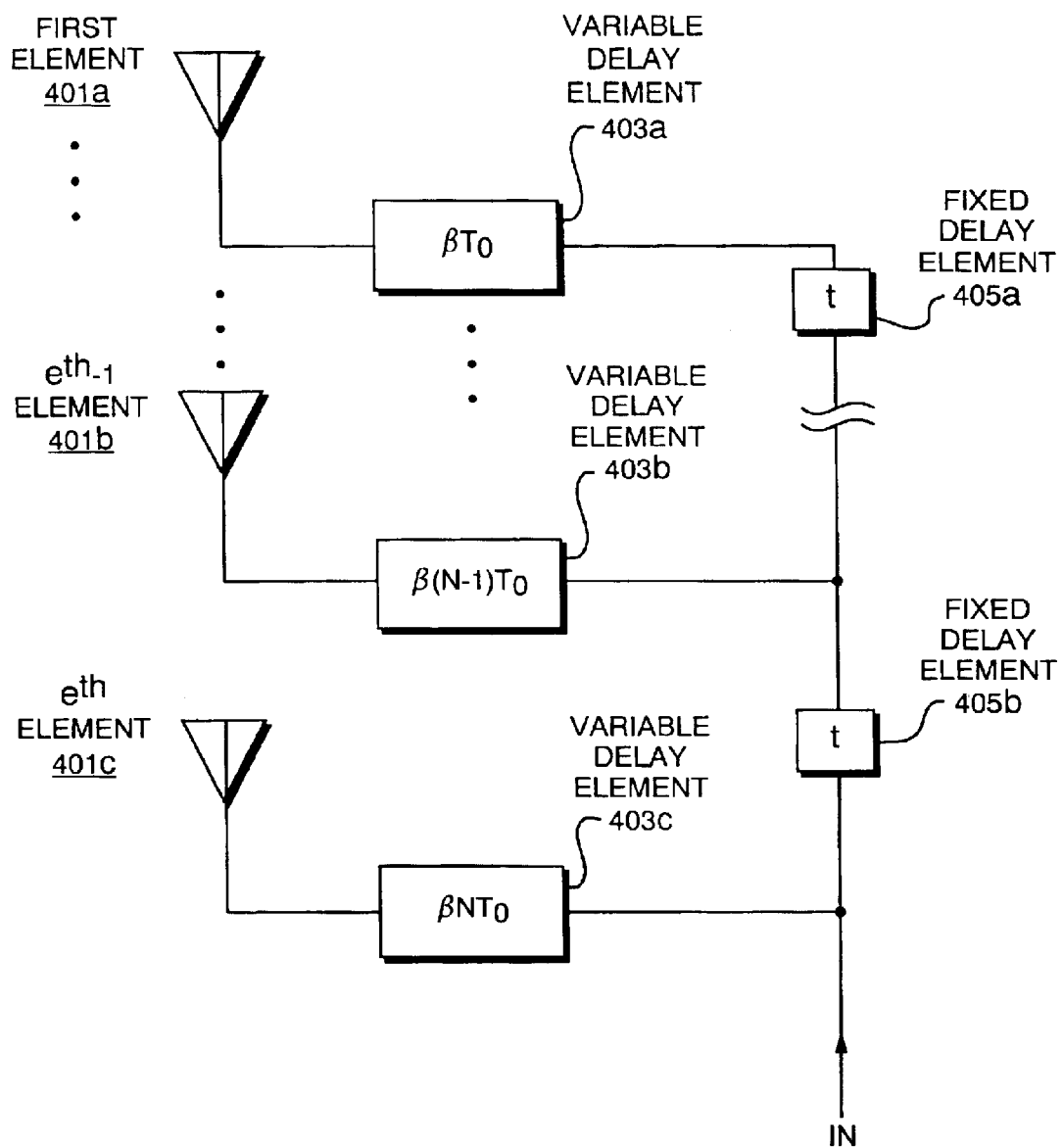
FIG. 4 illustrates a phased array configured in accordance with an embodiment of the present invention.

FIG. 4 illustrates a phased array configured in accordance with an embodiment of the present invention. The array includes e elements (e.g., first element 401a, $e^{th-1}$ element 401b, and $e^{th}$ element 401c), a number of variable delay elements (e.g., 403a, 403b, and 403c), and a number of fixed delay elements (e.g., 405a and 405b), each configured to provide a fixed delay of L. In this particular embodiment, note that the beam direction is independent of the operating frequency. Further note that the propagation delay is independent of the operating frequency.

The variable delay elements 403 are configured with an activation layer in accordance with the principles of the present invention so as to allow their associated propagation delay to be electronically controlled. The fixed delay elements 405 can be implemented, for example, as a meanderline in an unfolded or folded configuration with no activation layer.

The propagation delay through the array can be expressed as $\beta T_o N$, where $T_o$ is the delay with no activation of the activation layer (including delay t provided by fixed elements 405), $\beta$ is the activation factor, and N is the number of turns in a delay element. Let $D_e = (N-e) t + (BT_o) e$, where $D_e$ is the time delay to the $e^{th}$ element. If t equals $\beta T_o$, then $D_e$ equals Nt, and the beam angle is about 90°. The differential antenna element delay is $\Delta D_e$, which equals $\beta T_o$-t. By mounting the delay elements on a common activation layer, $\Delta D_e$ and thus the beam angle can be changed with one voltage.

Note that the activation factor associated with the activation layer will vary depending on how the activation layer is implemented. For instance, assume the activation layer is implemented as a semi-conductor varactor layer that is adapted to provide a range of capacitance (e.g., 1 pF to 50 pF). The activation factor might be 1.0 when the activation layer is not activated (unstimulated), and therefore providing its full value of capacitance. The propagation delay is through an N turn antenna would therefore be $T_O$. However, as the stimulus applied to the activation layer is increased, the activation factor decreases thereby decreasing the propagation delay through the antenna.

In an alternative embodiment, an activation factor of 1.0 can be set to correspond to the middle of the capacitance range provided by the activation layer. In such an embodiment, the activation layer may actually be stimulated, but still provide an activation factor of 1.0. The activation factor can then either be increased (e.g., from 1.0 to 1.3 by decreasing the applied stimulus) or decreased (e.g., from 1.0 to 0.4 by increasing the applied stimulus) depending on the desired propagation constant. The propagation delay through the antenna can be increased or decreased accordingly.

The principles discussed herein can readily be applied to characteristics of other activation layer types. Consider, for example, a piezoelectric layer adapted to provide a range of spacing between antenna sections and the ground plane. Here, an activation factor of 1.0 can be assigned to one end of that range where the activation layer is either completely unstimulated or fully stimulated. Alternatively, an activation factor of 1.0 can be assigned to some middle point of the range, and associated with a pre-established "unity stimulus." A unity stimulus for providing an activation factor of 1.0 can be established, for example, through actual testing or empirical data.

Figure 5:
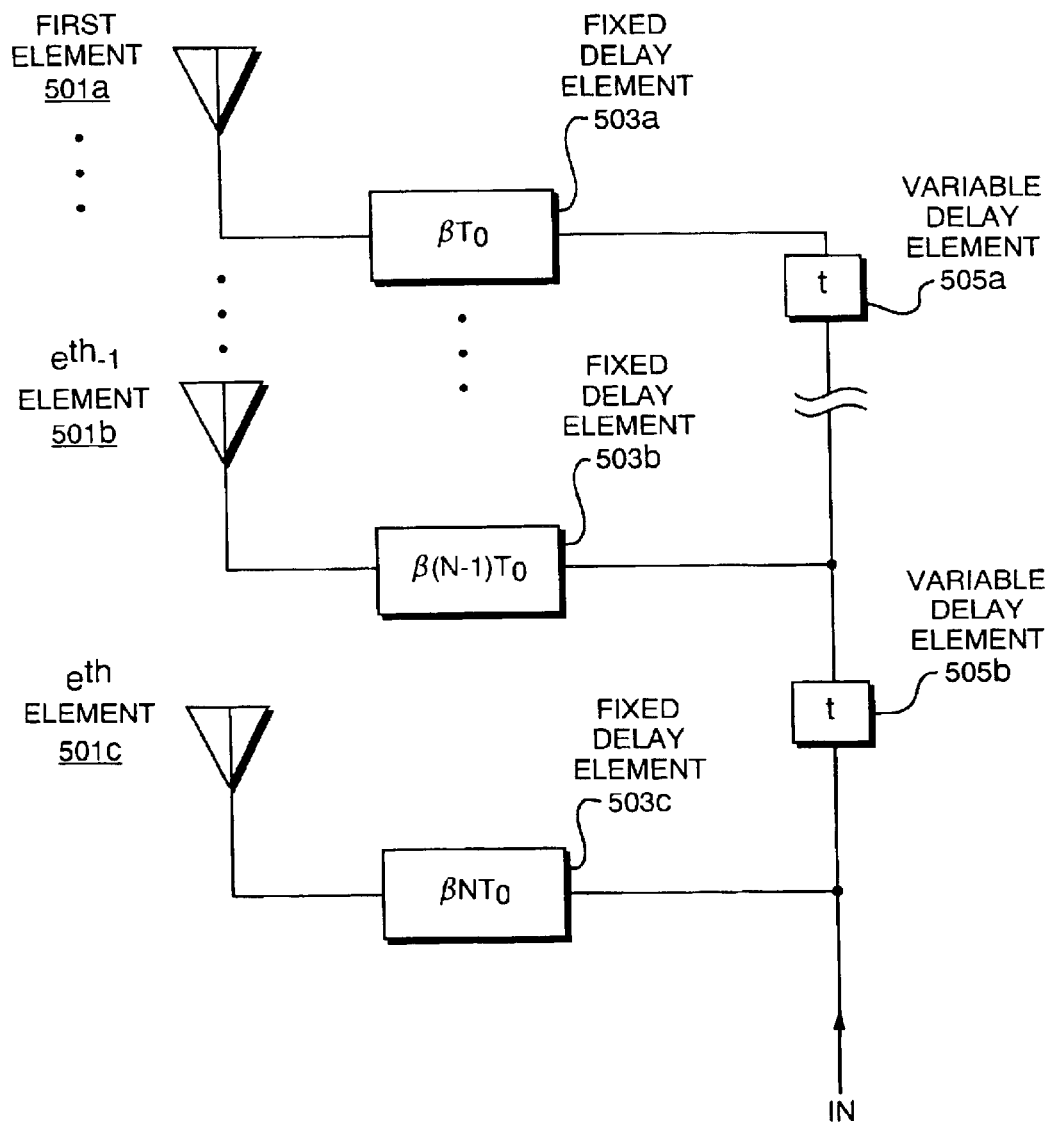
FIG. 5 illustrates a phased array configured in accordance with another embodiment of the present invention.

FIG. 5 illustrates a phased array configured in accordance with another embodiment of the present invention. As can be seen, the array includes c elements (e.g., first element 501a, $e^{th-1}$ element 501b, and $e^{th}$ element 501c), and a number of variable delay elements (e.g., 505a and 505b) are employed in place of the fixed delay elements 405a and 405b of FIG. 4. Likewise, a number of fixed delay elements (e.g., 503a, 503b, and 503c) are employed in place of the variable delay elements 403a, 403b, and 403c of FIG. 4. Such an embodiment allows for further flexibility in manipulating the propagation delay through an antenna array. Again, note that the beam direction and propagation delay are independent of the operating frequency.

The foregoing description of the embodiments of the invention has been presented for the purposes of illustration and description. It is not intended to be exhaustive or to limit the invention to the precise form disclosed. Many modifications and variations are possible in light of the above teaching. For example, the activation layer need not be limited to that having characteristics of variable capacitance or variable shape, but can be implemented with any materials or devices having the type of variable characteristics that can be stimulated or otherwise manipulated to effect control over section impedance values of the VITL. In addition, the use of dielectric layers may or may not be necessary depending on how the activation layer is implemented. It is intended that the scope of the invention be limited not by this detailed description, but rather by the claims appended hereto.

What is claimed is:

1. A method for manufacturing a variable impedance transmission line (VITL), the method comprising:

providing a conductive reference plane;

providing an activation layer between the conductive reference plane stud one or more sections of a VITL conductor thereby defining a number of low impedance sections and high impedance sections, with each impedance section being substantially the same in length, wherein the activation layer has characteristics which change in response to electrical stimulus thereby enabling control over section impedance independent of antenna operating frequency.

2. The method of claim 1 wherein the activation layer is provided between one or more of the lower impedance sections and the conductive reference plane, thereby enabling individual control over impedance of each of those lower impedance sections.

3. The method of claim 1 wherein the activation layer is implemented as at least one of a semi-conductor varactor layer and a number of discrete varactor devices.

4. The method of claim 1 wherein the activation layer is adapted to piezoclectrically change spacing between one or more of the lower impedance sections and the conductive reference plane, thereby enabling individual control over impedance of each of those lower impedance sections.

5. The method of claim 1 wherein the characteristics of the activation layer include at least one of variable capacitance and variable shape which changes in response to the electrical stimulus thereby enabling the control over section impedance.

6. The method of claim 1 wherein the electrical stimulus is a voltage that is provided to the activation layer to control propagation delay through the VITL.

7. A variable impedance transmission line (VITL) circuit comprising:

a conductive reference plane;

an activation layer operatively coupled between the conductive reference plane and one or more sections of a VITL conductor thereby defining a number of low impedance sections and high impedance sections, wherein the activation layer is adapted to provide a change in spacing between one or more sections and the conductive reference plane in response to electrical stimulus, thereby enabling control over section impedance independent of antenna operating frequency.

8. The circuit claim 7 wherein the activation layer is provided between one or more of the lower impedance sections and the conductive reference plane, thereby enabling individual control over impedance of each of those lower impedance sections.

9. The circuit of claim 7 wherein the activation layer is implemented as at least one of a semi-conductor layer and a number of discrete devices.

10. The circuit of claim 7 wherein the activation layer is implemented as a number of discrete piezoelectric devices.

11. The circuit of claim 7 wherein the activation layer is implemented as a piezoelectric layer.

12. The circuit of claim 7 wherein the activation layer is adapted to piezoelectrically change spacing between one or more of the lower impedance sections and the conductive reference plane.

13. The circuit of claim 7 wherein an activation factor associated with the activation layer changes relative to the changes in spacing, in response to an electrical stimulus.

14. The circuit of claim 7 wherein the electrical stimulus is a voltage that is provided to the activation layer to control propagation delay through the VITL.

15. A method for controlling propagation delay through a variable impedance transmission line, the method comprising:

providing an activation layer operatively coupled between a conductive reference plane and a variable impedance transmission line conductor, the conductor having a number of high impedance sections and low impedance sections, with each impedance section being substantially the same in length; and electronically stimulating the activation layer to change its characteristics so as to enable control over propagation delay through the variable impedance transmission line independent of antenna operating frequency.

16. The method of claim 15 wherein electronically stimulating the activation layer to change its characteristics includes applying a voltage to the activation layer.

17. The method of claim 15 wherein electronically stimulating the activation layer to change its characteristics includes changing capacitance between one or more lower impedance sections and the conductive reference plane.

18. The method of claim 15 wherein electronically stimulating the activation layer to change its characteristics includes piezoelectrically changing spacing between one or more lower impedance sections and the conductive reference plane.

19. The method of claim 15 wherein the characteristics of the activation layer include at least one of variable capacitance and variable shape which changes in response to an electrical stimulus.

20. The method of claim 15 wherein the method is carried out during a beamforming process performed by a phased array.

* * * * *

UNITED STATES PATENT AND TRADEMARK OFFICE
CERTIFICATE OF CORRECTION

PATENT NO. : 6,774,745 B2
DATED : August 10, 2004
INVENTOR(S) : John T. Apostolos It is certified that error appears in the above-identified patent and that said Letters Patent is hereby corrected as shown below:

Column 2,
Line 3, delete "mechanically switching or" insert -- mechanically switching in or --.

Column 4,
Line 1, delete "degree".

Column 6,
Line 65, delete "c", insert -- e --.

Column 7,
Line 30, delete "stud" insert -- and --.

Signed and Sealed this

Eighteenth Day of October, 2005

JON W. DUDAS
*Director of the United States Patent and Trademark Office*